United States Patent
Yoshimine (10) Patent No.: US 9,935,227 B2
(45) Date of Patent: Apr. 3, 2018

(54) SOLAR CELL MODULE AND METHOD OF MANUFACTURING SAME

(71) Applicant: Panasonic Intellectual Property Management Co., Ltd., Osaka (JP)

(72) Inventor: Yukihiro Yoshimine, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/979,711

(22) Filed: Dec. 28, 2015

(65) Prior Publication Data

US 2016/0111574 A1    Apr. 21, 2016

Related U.S. Application Data

(63) Continuation of application No. PCT/JP2014/065091, filed on Jun. 6, 2014.

(30) Foreign Application Priority Data

Jun. 28, 2013 (JP) ................. 2013-136706

(51) Int. Cl.
*H01L 31/048* (2014.01)
*H01L 31/05* (2014.01)
*H01L 31/02* (2006.01)

(52) U.S. Cl.
CPC ...... *H01L 31/0508* (2013.01); *H01L 31/0201* (2013.01); *H01L 31/048* (2013.01);
(Continued)

(58) Field of Classification Search
CPC ................. H01L 31/05; H01L 31/02
(Continued)

(56) References Cited

U.S. PATENT DOCUMENTS 9,123,836 B2    9/2015 Kataoka
2004/0192082 A1*  9/2004 Wagner ................ H05K 1/0283
439/67
(Continued)

FOREIGN PATENT DOCUMENTS

CN    202004010 U  * 10/2011
JP    2006310745 A * 11/2006
(Continued)

OTHER PUBLICATIONS

Shen et al., CN 202004010 U, English machine translation, China.*
JP 2006310745 A, Taekashi et al., Japan, English Machine Translation.*

*Primary Examiner* — Tae-Sik Kang
(74) *Attorney, Agent, or Firm* — Metrolexis Law Group, PLLC (57) ABSTRACT

A solar cell module includes: solar cells, each of which includes first and second principal surfaces, on which a first and second bus bar electrodes are provided respectively; a wiring member connecting the first bus bar electrode of one of adjacent solar cells and the second bus bar electrode of the other adjacent solar cell; a first resin adhesive layer connecting the wiring member and the first bus bar electrode; and a second resin adhesive layer connecting the wiring member and the second bus bar electrode. The wiring member includes a first bent section bent toward the second principal surface at an end of the first bus bar electrode or the first resin adhesive layer on the adjacent side, and a second bent section bent toward the first principal surface at an end of the second bus bar electrode or the second resin adhesive layer on the adjacent side.

8 Claims, 8 Drawing Sheets

(52) U.S. Cl.
CPC .......... *H01L 31/05* (2013.01); *H01L 31/0512* (2013.01); *Y02E 10/50* (2013.01)

(58) Field of Classification Search
USPC ........................................................ 136/244
See application file for complete search history.

(56) References Cited

U.S. PATENT DOCUMENTS

| | | | |
|---|---|---|---|
| 2007/0283997 A1* | 12/2007 | Hachtmann | H01L 31/03928 136/244 |
| 2009/0235972 A1* | 9/2009 | Fukushima | H01L 31/0512 136/244 |
| 2013/0340828 A1 | 12/2013 | Kataoka | |
| 2014/0190547 A1 | 7/2014 | Yoshimine | |

FOREIGN PATENT DOCUMENTS

| | | |
|---|---|---|
| WO | 2012121003 A1 | 9/2012 |
| WO | 2013114555 A1 | 8/2013 |

\* cited by examiner

SOLAR CELL MODULE AND METHOD OF MANUFACTURING SAME

CROSS REFERENCE TO RELATED APPLICATIONS

This application is a continuation application of PCT/JP2014/065091, filed on Jun. 6, 2014, which claims priority from prior Japanese Patent Applications No. 2013-136706, filed on Jun. 28, 2013, entitled "SOLAR CELL MODULE AND METHOD OF MANUFACTURING SAME", the entire contents of which are incorporated herein by reference.

TECHNICAL FIELD

This disclosure relates to a solar cell module and a method of manufacturing the same.

BACKGROUND ART

A solar cell module is generally formed by arraying solar cell strings in which solar cells are arrayed and the solar cells are electrically connected to each other by a wiring member. The solar cell strings are sealed in a bonding layer filled between a pair of protective members.

Patent Document 1 points out that, in such a solar cell module, gas generated from a filler material remains on interfaces of a back surface protective member, a back surface filler material, a solar cell, a front surface filler material and a front surface transparent protective member, making bubbles likely to be generated. Such bubbles could lower reliability.

PATENT DOCUMENT

Patent Document 1: WO 2012/121003

SUMMARY OF THE INVENTION

It is an object of the invention to provide a solar cell module having improved reliability.

A first aspect of the invention is a solar cell module that includes: solar cells arrayed in a predetermined direction, each of the solar cells including a first principal surface, on which a first bus bar electrode is provided, and a second principal surface, on which a second bus bar electrode is provided; a wiring member that connects, between adjacent ones of the solar cells, the first bus bar electrode in one of the solar cells and the second bus bar electrode in the other solar cell; a first resin adhesive layer that connects the wiring member and the first bus bar electrode; and a second resin adhesive layer that connects the wiring member and the second bus bar electrode. The wiring member includes a first bent section bent toward the second principal surface at an end of the first bus bar electrode or the first resin adhesive layer on the adjacent side, and a second bent section bent toward the first principal surface at an end of the second bus bar electrode or the second resin adhesive layer on the adjacent side.

A second aspect of the invention is a manufacturing method that includes: preparing the solar cells and the wiring member; and connecting the one end of the wiring member to the first bus bar electrode by the first resin adhesive layer and connecting the other end of the wiring member to the second bus bar electrode by the second resin adhesive layer.

The aspect(s) of the invention makes it possible to provide a solar cell module having improved reliability.

MODES FOR CARRYING OUT THE INVENTION

Hereinafter, preferred embodiments are described. However, the following embodiments are provided herein for illustrative purpose only, and the invention is not limited to the following embodiments. Moreover, in the following drawings, members having substantially the same functions may be denoted by the same reference numerals.

<First Embodiment>

Figure 1:
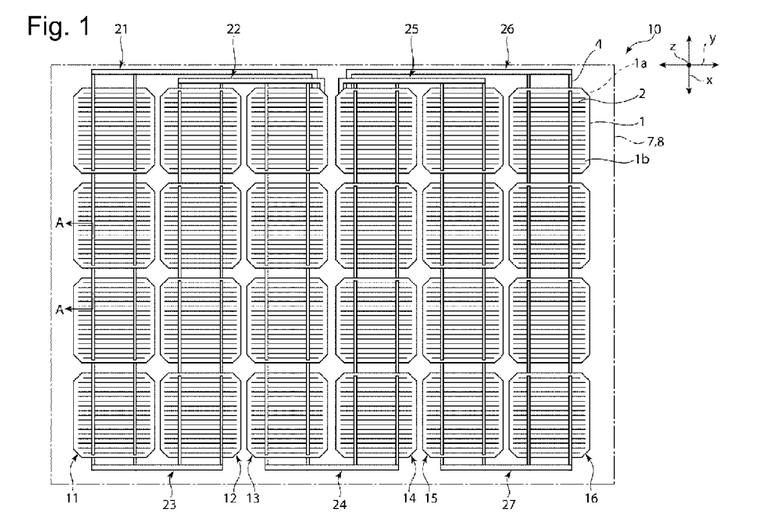
FIG. 1 is a schematic plan view illustrating a solar cell module according to a first embodiment.

FIG. 1 is a schematic plan view illustrating a solar cell module according to a first embodiment. As illustrated in FIG. 1, solar cell module 10 includes solar cell strings 11 to 16 which are arrayed in a second direction (y direction). Solar cell strings 11 to 16 are each formed by electrically connecting solar cells 1 arrayed in a first direction (x direction). Note that, in this specification, the "first direction" is a direction in which solar cells 1 are arrayed within solar cell strings 11 to 16. Meanwhile, the "second direction" is a direction in which solar cell strings 11 to 16 are arrayed, that is, a direction approximately perpendicular to the first direction.

On front surface 1$b$ of each of solar cells 1, a large number of finger electrodes 2 extending in the second direction are formed. Also, bus bar electrodes extending in a direction approximately orthogonal to finger electrodes 2 are provided so as to be electrically connected to finger electrodes 2. Moreover, although not illustrated in FIG. 1, finger electrodes 2 and bus bar electrodes are also formed on back surface 1$a$ of solar cell 1, as in the case of front surface 1$b$. Note that finger electrodes 2 formed on back surface 1$a$ are formed more densely than those formed on front surface 1b. Finger electrodes 2 and the bus bar electrodes formed on back surface 1a are included in a back surface electrode of solar cell 1.

In FIG. 1, the bus bar electrodes on front surface 1b are illustrated overlapping with wiring members 4. The bus bar electrodes on front surface 1b are thus provided so as to extend in the first direction of solar cell 1. Note that the extending direction of the bus bar electrodes is not limited to the straight line parallel to the first direction. For example, the bus bar electrodes may extend in a zig-zag pattern in which straight lines not parallel to the first direction are connected together.

As illustrated in FIG. 1, wiring members 4 provided on the front surface 1b side of the top solar cell 1 in solar cell string 11 are connected to first interconnection wiring member 21. Wiring members 4 provided on the back surface 1a side of the bottom solar cell 1 in solar cell string 11 are connected to third interconnection wiring member 23. Wiring members 4 provided on back surface 1a side of the top solar cell 1 in solar cell string 12 are connected to second interconnection wiring member 22. Wiring members 4 provided on the front surface 1b side of the bottom solar cell 1 in solar cell string 12 are connected to third interconnection wiring member 23. Wiring members 4 provided on the front surface 1b side of the top solar cell 1 in solar cell string 13 are connected to second interconnection wiring member 22. Wiring members 4 provided on the back surface 1a side of the bottom solar cell 1 in solar cell string 13 are connected to third interconnection wiring member 24.

Wiring members 4 provided on the back surface 1a side of the top solar cell 1 in solar cell string 14 are connected to second interconnection wiring member 25. Wiring members 4 provided on the front surface 1b side of the bottom solar cell 1 in solar cell string 14 are connected to third interconnection wiring member 24. Wiring members 4 provided on the front surface 1b side of the top solar cell 1 in solar cell string 15 are connected to second interconnection wiring member 25. Wiring members 4 provided on the back surface 1a side of the bottom solar cell 1 in solar cell string 15 are connected to third interconnection wiring member 27. Wiring members 4 provided on the back surface 1a side of the top solar cell 1 in solar cell string 16 are connected to first interconnection wiring member 26. Wiring members 4 provided on the front surface 1b side of the bottom solar cell 1 in solar cell string 13 are connected to third interconnection wiring member 27.

As described above, solar cell strings 11 to 16 are connected in series or in parallel to each other through connection to any of first interconnection wiring members 21 and 26, second interconnection wiring members 22 and 25 and third interconnection wiring members 23, 24 and 27.

Figure 2:
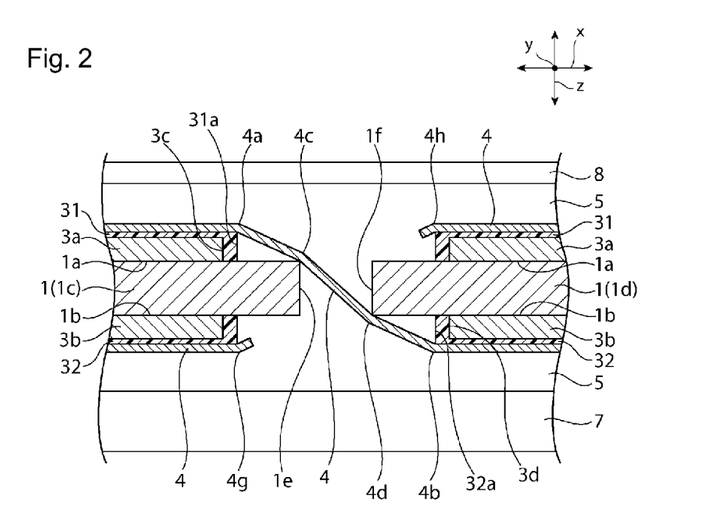
FIG. 2 is a schematic cross-sectional view taken along the line A-A in FIG. 1, illustrating the solar cell module according to the first embodiment.

FIG. 2 is a schematic cross-sectional view taken along the line A-A in FIG. 1. As illustrated in FIG. 2, first bus bar electrode 3a is provided on first principal surface 1a of each of solar cells 1 ((1c) and (1d)), and second bus bar electrode 3b is provided on second principal surface 1b thereof. First principal surface 1a corresponds to the back surface described above, while second principal surface 1b corresponds to the front surface described above.

As described above, adjacent solar cells 1c and 1d are electrically connected to each other by wiring member 4. To be more specific, one end of wiring member 4 is electrically connected to first bus bar electrode 3a of solar cell 1c, and the other end of wiring member 4 is electrically connected to second bus bar electrode 3b of solar cell 1d. First bus bar electrode 3a and the one end of wiring member 4 are electrically connected by first resin adhesive layer 31. Second bus bar electrode 3b and the other end of wiring member 4 are electrically connected by second resin adhesive layer 32. As for wiring member 4, a low-resistance material such as copper, silver and aluminum, for example, is used as a core. Wiring member 4 can be formed by silver-plating the surface of the core or by solder plating or the like in consideration of connectivity with the interconnection wiring member, and the like.

In this embodiment, first resin adhesive layer 31 and second resin adhesive layer 32 are resin adhesive layers, each containing a conductive material, which are provided between first bus bar electrode 3a and wiring member 4 and between second bus bar electrode 3b and wiring member 4. Moreover, first resin adhesive layer 31 and second resin adhesive layer 32 run off the edges between wiring member 4 and the first and second bus bar electrodes, and cover end 3c of first bus bar electrode 3a and end 3d of second bus bar electrode 3b.

Each of first and second resin adhesive layers 31 and 32 is not limited to the resin adhesive layer containing the conductive material, but may be formed using a resin adhesive containing no conductive material. In this case, first and second resin adhesive layers 31 and 32 are formed so as to cover the sides of first bus bar electrode 3a and wiring member 4 and the sides of second bus bar electrode 3b and wiring member 4, respectively. In this case, first bus bar electrode 3a and wiring member 4 are electrically connected by coming into direct contact with each other. Likewise, second bus bar electrode 3b and wiring member 4 are electrically connected by coming into direct contact with each other. First and second resin adhesive layers 31 and 32 can be made of epoxy resin, acrylic resin, urethane resin, phenol resin, silicone resin, a mixture thereof or the like, for example.

First protective member 7 is provided on the second principal surface 1b side of solar cell 1, which serves as the light-receiving side. First protective member 7 can be made of glass or the like, for example. Second protective member 8 is provided on the first principal surface 1a side of solar cell 1. Second protective member 8 can be made of resin, for example. Alternatively, second protective member 8 may be made of a resin sheet in which a metal layer made of aluminum or the like is provided.

Bonding layer 5 is provided between first and second protective members 7 and 8. Bonding layer 5 can be made of resin, for example. As for such resin, non-cross-linked resin made of polyethylene, polypropylene or the like, ethylene-vinyl acetate (EVA) copolymer, cross-linked resin made of polyethylene, polypropylene or the like, and the like are available.

As illustrated in FIG. 2, wiring member 4 includes first bent section 4a bent toward second principal surface 1b at end 31a of first resin adhesive layer 31. Wiring member 4 also includes second bent section 4b bent toward first principal surface 1a at end 32a of second resin adhesive layer 32. Furthermore, in this embodiment, wiring member 4 includes third bent section 4c and fourth bent section 4d as additional bent sections between first bent section 4a and second bent section 4b. Third bent section 4c is formed at end 1e of one solar cell 1c, and is bent toward second principal surface 1b. Fourth bent section 4d is formed at end 1f of the other solar cell 1d, and is bent toward first principal surface 1a.

Figure 11:
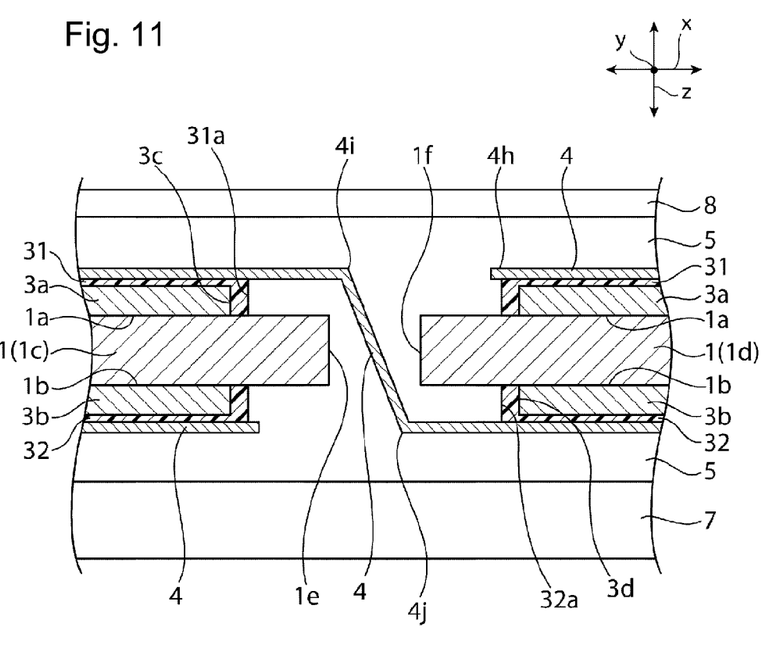
FIG. 11 is a schematic cross-sectional view illustrating between solar cells in a conventional solar cell module.

FIG. 11 is a schematic cross-sectional view illustrating between solar cells in a conventional solar cell module. In the conventional solar cell module, as illustrated in FIG. 11, bent section 4*i* and bent section 4*j* are formed between end 1*e* of solar cell 1*c* and end 1*f* of solar cell 1*d*. Thus, large gaps are formed between solar cell 1*c* and wiring member 4 and between solar cell 1*d* and wiring member 4. In the gaps, gas generated from a filler material that forms bonding layer 5 is accumulated. Therefore, there is a problem that bubbles are likely to stay behind between the solar cells.

The formation of the bubbles is attributable to gas generated by thermal decomposition of a cross-linker contained in a sealing film in a cross-linking step for sealing. More specifically, the gas generated by thermal decomposition of the cross-linker is considered to remain on interfaces of a back surface protective member, a back surface sealing film, a solar cell, a front surface sealing film and a front surface transparent protective member inside the solar cell, thereby generating bubbles inside the solar cell.

In this embodiment, first bent section 4*a* is formed at end 31*a* of first resin adhesive layer 31, and second bent section 4*b* is formed at end 32*a* of second resin adhesive layer 32. Thus, large gaps can be prevented from being formed between solar cell 1*c* and wiring member 4 and between solar cell 1*d* and wiring member 4. Thus, bubbles can be suppressed from staying behind between the solar cells due to the gas generated from the filler material. As a result, poor appearance can be suppressed.

Furthermore, in this embodiment, wiring member 4 is tilted by forming third and fourth bent sections 4*c* and 4*d*. Thus, compared with the conventional case where bent sections 4*i* and 4*j* are formed, the tilt angle of wiring member 4 between the bent sections can be reduced. As a result, bubbles can be suppressed from staying behind between the solar cells.

In this embodiment, the bending angle of third and fourth bent sections 4*c* and 4*d* is larger than the bending angle of first and second bent sections 4*a* and 4*b*. Thus, the distance between solar cells 1*c* and 1*d* can be reduced. As a result, an area ratio of the solar cells in the solar cell module can be increased, and thus power generation efficiency can be improved.

Note that, as illustrated in FIG. 2, bent section 4*g* and bent section 4*h* are formed at an end of wiring member 4 on second principal surface 1*b* side and an end of wiring member 4 on first principal surface 1*a* side, respectively. The formation of bent section 4*g* and bent section 4*h* can suppress bubbles from staying behind between the solar cells.

<Second Embodiment>

Figure 3:
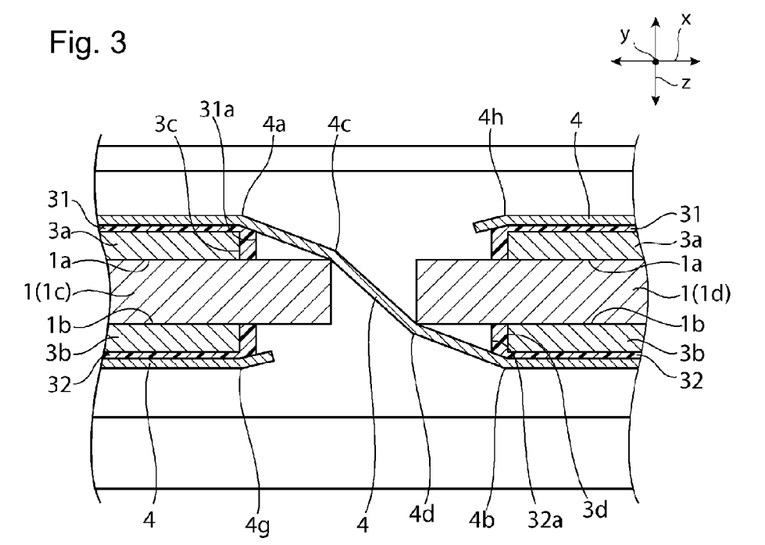
FIG. 3 is a schematic cross-sectional view illustrating a solar cell module according to a second embodiment.

FIG. 3 is a schematic cross-sectional view illustrating a solar cell module according to a second embodiment. As in the case of FIG. 2 in the first embodiment, FIG. 3 corresponds to a schematic cross-sectional view taken along the line A-A in FIG. 1. In this embodiment, first bent section 4*a* of wiring member 4 is formed at end 3*c* of first bus bar electrode 3*a* on the adjacent side, while second bent section 4*b* is formed at end 3*d* of second bus bar electrode 3*b* on the adjacent side. The other configuration is the same as that of the first embodiment.

In this embodiment, again, the formation of first and second bent sections 4*a* and 4*b* can suppress bubbles from staying behind between the solar cells due to gas generated from a filler material. As a result, poor appearance can be suppressed. Moreover, formation of third and fourth bent sections 4*c* and 4*d* can reduce the tilt angle of wiring member 4 between the bent sections. Thus, bubbles can be suppressed from staying behind between the solar cells.

<Third Embodiment>

Figure 4:
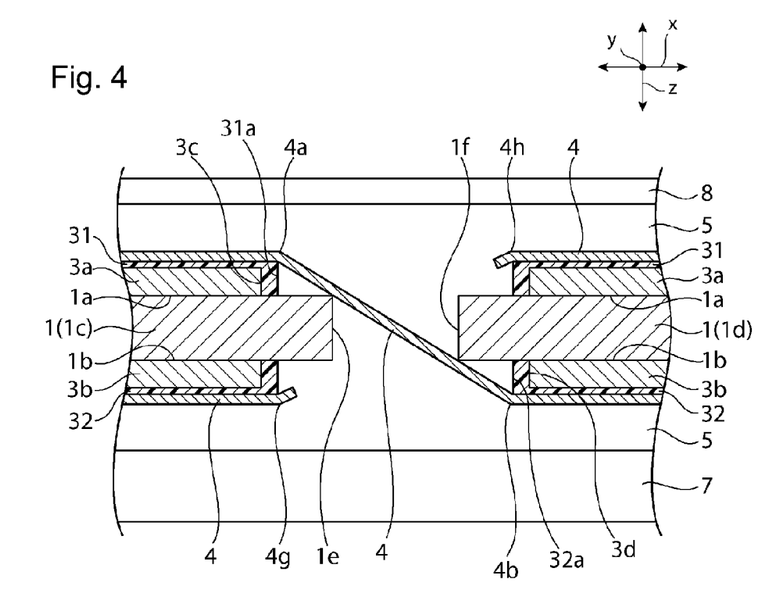
FIG. 4 is a schematic cross-sectional view illustrating a solar cell module according to a third embodiment.

FIG. 4 is a schematic cross-sectional view illustrating a solar cell module according to a third embodiment. As in the case of FIG. 2 in the first embodiment, FIG. 4 corresponds to a schematic cross-sectional view taken along the line A-A in FIG. 1. In this embodiment, third bent section 4*c* and fourth bent section 4*d* are not formed. Therefore, wiring member 4 between first and second bent sections 4*a* and 4*b* is linear with no bent section. The other configuration is the same as that of the first embodiment.

In this embodiment, again, the formation of first and second bent sections 4*a* and 4*b* can suppress bubbles from staying behind between the solar cells due to gas generated from a filler material. As a result, poor appearance can be suppressed.

<Fourth Embodiment>

Figure 5:
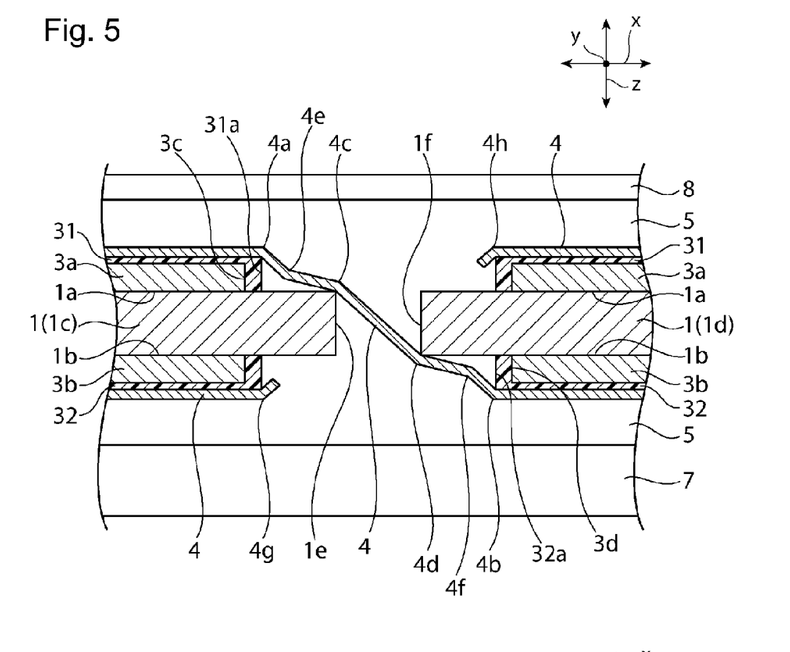
FIG. 5 is a schematic cross-sectional view illustrating a solar cell module according to a fourth embodiment.

FIG. 5 is a schematic cross-sectional view illustrating a solar cell module according to a fourth embodiment. As in the case of FIG. 2 in the first embodiment, FIG. 5 corresponds to a schematic cross-sectional view taken along the line A-A in FIG. 1. In this embodiment, fifth bent section 4*e* bent in an first bent section 4*a* is formed between first and third bent sections 4*a* and 4*c*, and sixth bent section 4*f* bent in an opposite manner to second bent section 4*b* is formed between second and fourth bent sections 4*b* and 4*d*. The other configuration is the same as that of the first embodiment.

In this embodiment, first and second bent sections 4*a* and 4*b* are formed, and fifth and sixth bent sections 4*e* and 4*f* are further formed, which are bent in an opposite manner to first and second bent sections 4*a* and 4*b*, respectively. Thus, the gaps between solar cell 1*c* and wiring member 4 and between solar cell 1*d* and wiring member 4 can be further reduced. Therefore, bubbles can be further suppressed from staying behind between the solar cells due to gas generated from a filler material. As a result, poor appearance can be further suppressed.

Moreover, the formation of third and fourth bent sections 4*c* and 4*d* can reduce the tilt angle of wiring member 4 between the bent sections. Thus, bubbles can be suppressed from staying behind between the solar cells.

<Fifth Embodiment>

Figure 6:
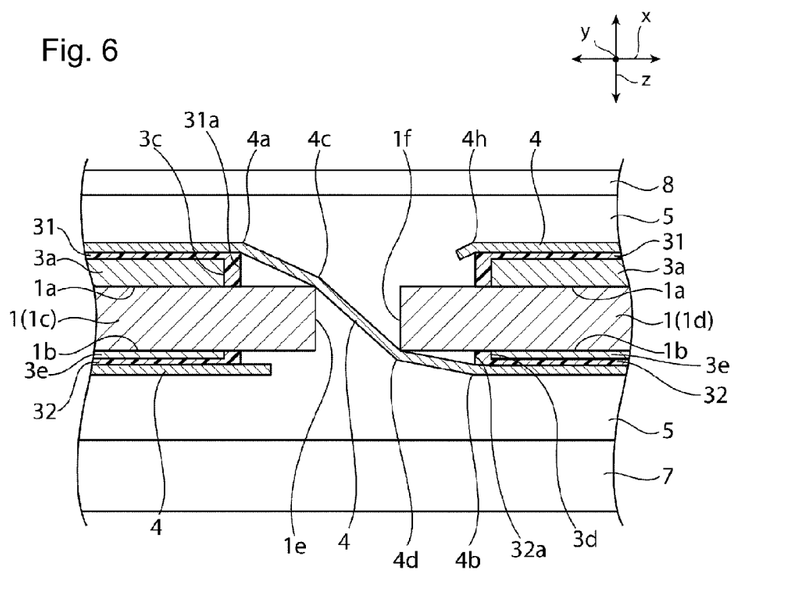
FIG. 6 is a schematic cross-sectional view illustrating a solar cell module according to a fifth embodiment.

FIG. 6 is a schematic cross-sectional view illustrating a solar cell module according to a fifth embodiment. As in the case of FIG. 2 in the first embodiment, FIG. 6 corresponds to a schematic cross-sectional view taken along the line A-A in FIG. 1. In this embodiment, metal electrode 3*e* is formed on the entire back surface as aback surface electrode to be formed on second principal surface 1*b* side of solar cells 1*c* and 1*d*. Since metal electrode 3*e* is very thin, a gap between solar cell 1*d* and wiring member 4 is sufficiently reduced on second principal surface 1*b* side. Thus, the gap is less likely to become the origin of generation of bubbles.

<Other Embodiments>

In the periphery of a solar cell, generally, there is an inactive region in which no pn junction nor pin junction is formed. Light entering the inactive region does not contribute to power generation. Thus, in order to reflect light entering the inactive region and make the light re-enter an active region in the solar cell, it is conceivable to provide a reflection layer in the periphery of the solar cell. As such a reflection layer, a resin layer containing white pigment such as titanium oxide, for example, can be formed. When such a resin layer or the like is formed in the periphery of the solar cell, a bent section is formed also at an end of such a resin layer or the like. Such a resin layer or the like may be formed only on the first principal surface side of the solar cell or may be formed on both the first principal surface side and the second principal surface side. Moreover, the resin layer may be formed so as to cover the entire end of the solar cell.

<Embodiment of Manufacturing Method>

Figure 7:
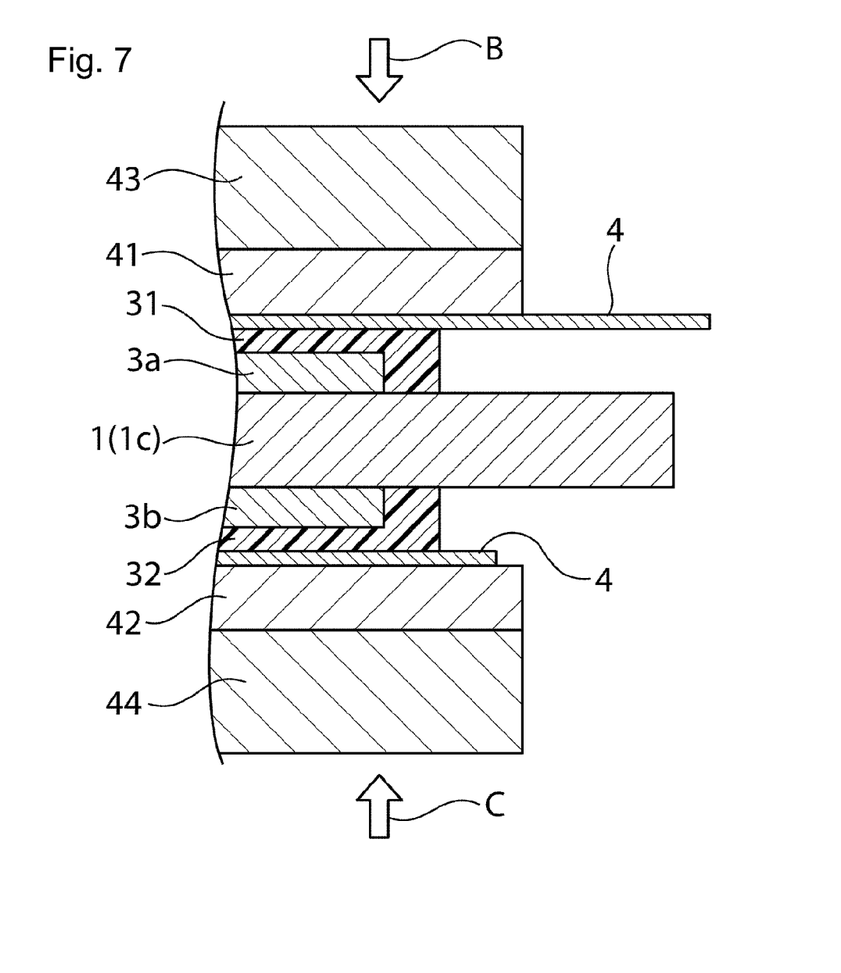
FIG. 7 is a schematic cross-sectional view for explaining a step of electrically connecting a wiring member by pressure bonding to a bus bar electrode.
Figure 8:
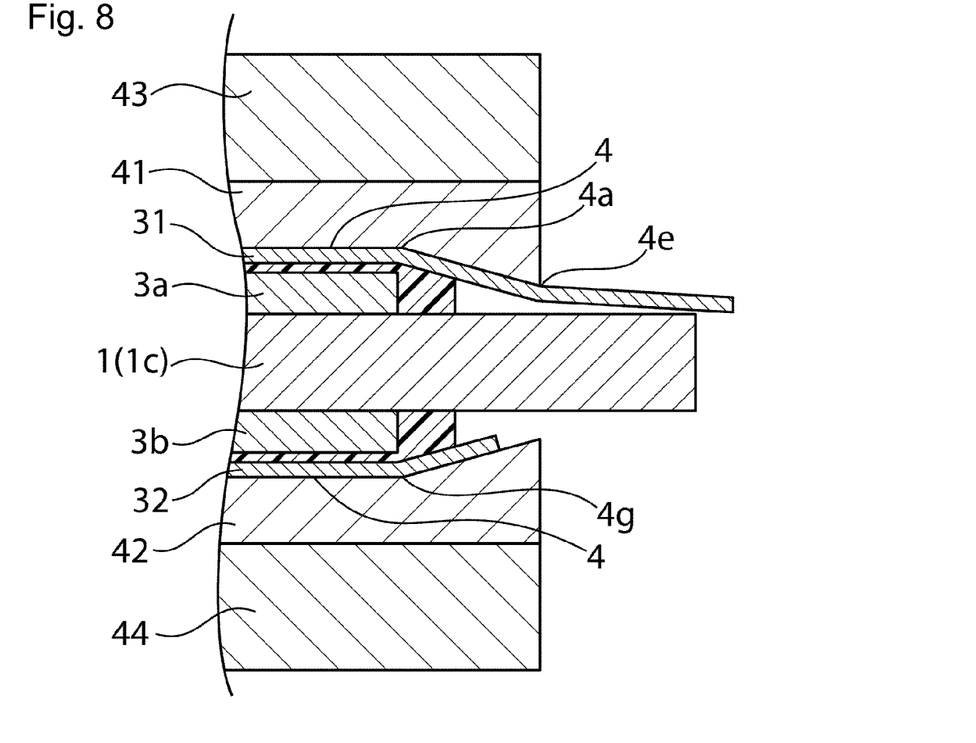
FIG. 8 is a schematic cross-sectional view for explaining the step of electrically connecting the wiring member by pressure bonding to the bus bar electrode.

FIGS. 7 and 8 are schematic cross-sectional views for explaining steps of electrically connecting wiring members by pressure bonding to bus bar electrodes. As illustrated in FIG. 7, first resin adhesive layer 31 and second resin adhesive layer 32 are disposed on first bus bar electrode 3a and second bus bar electrode 3b in solar cell 1 (1c), respectively, and linear wiring members 4 are disposed thereon. In this state, solar cell 1 (1c) is sandwiched between pressure bonding tool 43 having silicone rubber sheet 41 provided on its surface and pressure bonding tool 44 having silicone rubber sheet 42 provided on its surface.

Next, pressure bonding tool 43 is moved in an arrow B direction, and pressure bonding tool 44 is moved in an arrow C direction. Thus, wiring members 4 are pressure-bonded to first bus bar electrode 3a and second bus bar electrode 3b through first resin adhesive layer 31 and second resin adhesive layer 32, respectively.

FIG. 8 illustrates a state after pressure bonding tools 43 and 44 are moved as described above. As illustrated in FIG. 8, silicone rubber sheets 41 and 42 press wiring members 4 to be pressure-bonded to first and second bus bar electrodes 3a and 3b, and also press portions where first and second bus bar electrodes 3a and 3b are not provided. Thus, first bent section 4a, fifth bent section 4e and bent section 4g are formed in wiring members 4. Second bent section 4b, sixth bent section 4f and bent section 4h illustrated in FIG. 5 can also be formed in the same manner.

Note that, by adjusting the positions of the ends of pressure bonding tools 43 and 44 and the position of the end of solar cell 1, only first bent section 4a, second bent section 4b and bent sections 4g and 4h can be formed without forming fifth bent section 4e and sixth bent section 4f as in the embodiments illustrated in FIGS. 2 to 4.

As described above, according to the embodiment illustrated in FIGS. 7 and 8, linear wiring member 4 is prepared as wiring member 4, and the bent sections can be formed in wiring member 4 when one end and the other end of wiring member 4 are electrically connected to first and second bus bar electrodes 3a and 3b, respectively.

Figure 9A:
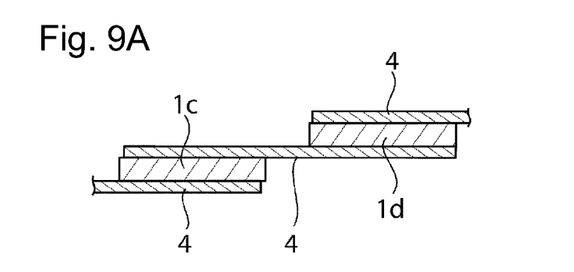
FIGS. 9A to 9C are schematic cross-sectional views for explaining steps of forming each bent section in the wiring member by relatively moving each solar cell after the wiring member is electrically connected to the bus bar electrode.
Figure 9B:
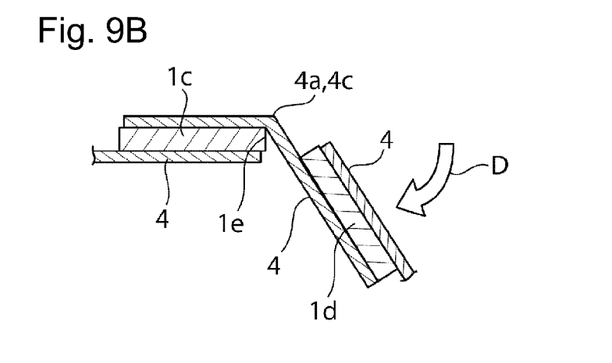
Figure 9C:
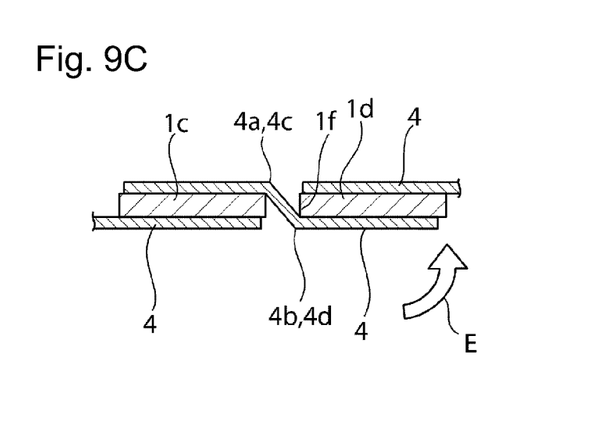

FIGS. 9A to 9C are schematic cross-sectional views for explaining steps of forming each bent section in the wiring member by relatively moving each solar cell after the wiring members are electrically connected to the bus bar electrodes. As illustrated in FIG. 9A, linear wiring members 4 are electrically connected to solar cells 1c and 1d. To be more specific, one end and the other end of linear wiring members 4 are electrically connected to first and second bus bar electrodes 3a and 3b (not illustrated in FIGS. 9A to 9C) in solar cells 1c and 1d.

Next, as illustrated in FIG. 9B, solar cell 1d is moved in an arrow D direction with end 1e of solar cell 1c as the fulcrum point of the bend. Thus, at least one of first bent section 4a and third bent section 4c can be formed. More specifically, both of first bent section 4a and third bent section 4c may be formed all at once, or only one of first bent section 4a and third bent section 4c may be formed.

Then, as illustrated in FIG. 9C, solar cell 1d is moved in an arrow E direction with end 1f of solar cell 1d as the fulcrum point of the bend. Thus, second bent section 4b and fourth bent section 4d can be formed. More specifically, both of second bent section 4b and fourth bent section 4d may be formed all at once, or only one of second bent section 4b and fourth bent section 4d may be formed.

As described above, according to the embodiment illustrated in FIGS. 9A to 9C, linear wiring members 4 are prepared as wiring members 4, and the bent sections can be formed in wiring members 4 by relatively moving solar cells 1c and 1d after one end and the other end of wiring members 4 are electrically connected to first and second bus bar electrodes 3a and 3b.

Figure 10A:
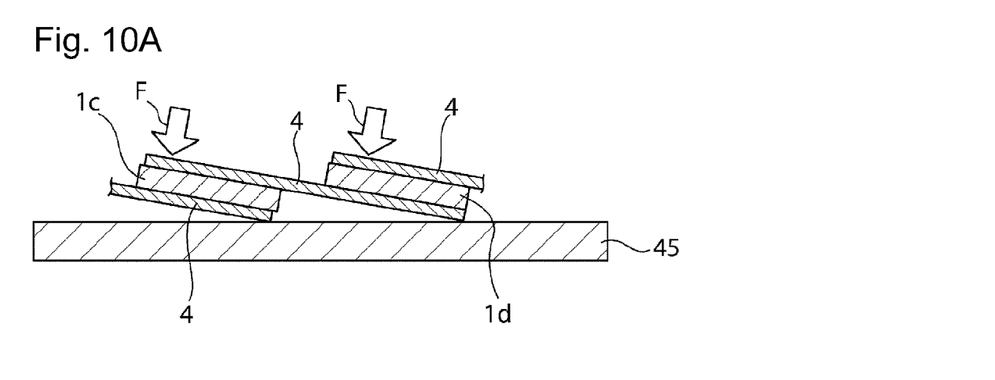
FIGS. 10A and 10B are schematic cross-sectional views for explaining steps of forming each bent section in the wiring member by pressing each solar cell, which is in a tilted state by the connection of the linear wiring member, into a horizontal position.
Figure 10B:
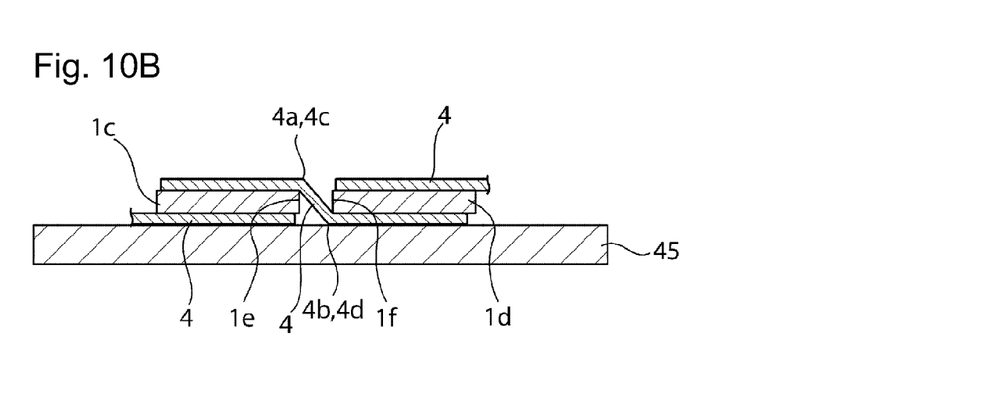

FIGS. 10A and 10B are schematic cross-sectional views for explaining steps of forming each bent section in the wiring member by pressing each solar cell, which is in a tilted state by the connection of the linear wiring member, into a horizontal position. As illustrated in FIG. 9A, linear wiring members 4 are electrically connected to solar cells 1c and 1d. Next, as illustrated in FIG. 10A, solar cells 1c and 1d having linear wiring members 4 connected thereto are placed on flat plate 45. Solar cells 1c and 1d are set in a tilted state with respect to flat plate 45 by the connection of linear wiring members 4.

Next, as illustrated in FIG. 10A, solar cells 1c and 1d are pressed in an arrow F direction. Thus, as illustrated in FIG. 10B, wiring member 4 is bent with end 1e of solar cell 1c as the fulcrum point of the bend. As a result, first bent section 4a and third bent section 4c are formed. At the same time, wiring member 4 is bent with end 1f of solar cell 1d as the fulcrum point of the bend. As a result, second bent section 4b and fourth bent section 4d are formed. Therefore, according to this embodiment, first bent section 4a and third bent section 4c can be simultaneously formed, while second bent section 4b and fourth bent section 4d can be simultaneously formed.

As described above, according to the embodiment illustrated in FIGS. 10A and 10B, linear wiring members 4 are prepared as wiring members 4, and the bent sections can be formed in wiring members 4 by pressing each of the solar cells, which is in a tilted state by the connection of linear wiring member 4, into a horizontal position after one end and the other end of wiring members 4 are electrically connected to first and second bus bar electrodes 3a and 3b.

In the above embodiments, the linear wiring member is prepared as wiring member 4, and the bent sections are formed by bending linear wiring member 4 in the step of manufacturing the solar cell module. However, the invention is not limited thereto, but a wiring member may be prepared, which has bent sections formed therein beforehand, and a solar cell module may be manufactured using the wiring member.

EXPLANATION OF REFERENCE NUMERALS 1 solar cell
1a first principal surface
1b second principal surface
1c, 1d solar cell
1e, 1f end
2 finger electrode
3a first bus bar electrode
3b second bus bar electrode
3c, 3d end
3e metal electrode
4 wiring member
4a first bent section
4b second bent section
4c third bent section
4d fourth bent section
4e fifth bent section
4f sixth bent section
4g, 4h, 4i, 4j bent section 5 bonding layer
7, 8 first and second protective members
10 solar cell module
11 to 16 solar cell string
11c solar cell
21, 26 first interconnection wiring member
22, 25 second interconnection wiring member
23, 24, 27 third interconnection wiring member
31, 32 first and second resin adhesive layers
31a, 32a end
41, 42 silicone rubber sheet
43, 44 pressure bonding tool
45 flat plate

The invention claimed is:

1. A solar cell module comprising:
solar cells arrayed in a predetermined direction, each of the solar cells including
a first principal surface on which a first bus bar electrode is provided, and
a second principal surface on which a second bus bar electrode is provided;
a wiring member that connects, between two adjacent solar cells of the solar cells, the first bus bar electrode of one solar cell of the two adjacent solar cells and the second bus bar electrode of the other solar cell of the two adjacent solar cells;
a first resin adhesive layer that connects the wiring member and the first bus bar electrode; and
a second resin adhesive layer that connects the wiring member and the second bus bar electrode, wherein
a first end of the first bus bar electrode or the first resin adhesive layer on the first principal surface of the one solar cell faces the first bus bar electrode or the first resin adhesive layer on the first principal surface of the other solar cell,
a second end of the second bus bar electrode or the second resin adhesive layer on the second principal surface of the other solar cell faces the second bus bar electrode or the second resin adhesive layer on the second principal surface of the one solar cell,
a third end of the one solar cell faces a fourth end of the other solar cell,
the wiring member comprises a first bent section, a third bent section, a fourth bent section and a second bent section that are arranged in this order along a longitudinal direction of the wiring member from the one solar cell to the other solar cell,
the first bent section is bent toward the second principal surface at the first end,
the third bent section is bent toward the second principal surface at the third end,
the fourth bent section is bent toward the first principal surface at the fourth end,
the second bent section is bent toward the first principal surface at the second end,
one longitudinal end of the wiring member comprises a first bent end portion, the first bent end portion being bent toward the second principal surface at a fifth end of the first resin adhesive layer on the first principal surface of the one solar cell, the fifth end being opposite to the first end, the first bent end portion being bent so as not to overlap the first bus bar electrode on the first principal surface of the one solar cell in a planar view of the solar cell module, and
the other longitudinal end of the wiring member comprises a second bent end portion, the second bent end portion being bent toward the first principal surface at a sixth end of the second resin adhesive layer on the second principal surface of the other solar cell, the sixth end being opposite to the second end, the second bent end portion being bent so as not to overlap the second bus bar electrode on the second principal surface of the other solar cell in the planar view of the solar cell module.

2. The solar cell module according to claim 1, wherein a bending angle of each of the third bent section and the fourth bent section is larger than a bending angle of each of the first bent section and the second bent section.

3. The solar cell module according to claim 1, wherein the wiring member comprises a fifth bent section between the first bent section and the third bent section, the fifth bent section being bent in an opposite manner to the first bent section, and a sixth bent section between the second bent section and the fourth bent section, the sixth bent section being bent in an opposite manner to the second bent section.

4. The solar cell module according to claim 1, wherein
the third end comprises a fulcrum point of the third bent section, and
the fourth end comprises a fulcrum point of the fourth bent section.

5. A solar cell module comprising:
solar cells arrayed in a predetermined direction, each of the solar cells including
a first principal surface on which a first bus bar electrode is provided, and
a second principal surface on which a second bus bar electrode is provided;
a wiring member that connects, between two adjacent solar cells of the solar cells, the first bus bar electrode of one solar cell of the two adjacent solar cells and the second bus bar electrode of the other solar cell of the two adjacent solar cells;
a first resin adhesive layer that connects the wiring member and the first bus bar electrode; and
a second resin adhesive layer that connects the wiring member and the second bus bar electrode, wherein
a first end of the first bus bar electrode or the first resin adhesive layer on the first principal surface of the one solar cell faces the first bus bar electrode or the first resin adhesive layer on the first principal surface of the other solar cell,
a second end of the second bus bar electrode or the second resin adhesive layer on the second principal surface of the other solar cell faces the second bus bar electrode or the second resin adhesive layer on the second principal surface of the one solar cell,
a third end of the one solar cell faces a fourth end of the other solar cell,
the wiring member comprises a first bent section, a third bent section, a fourth bent section and a second bent section that are arranged in this order along a longitudinal direction of the wiring member from the one solar cell to the other solar cell,
the first bent section is bent toward the second principal surface at the first end,
the third bent section is bent toward the second principal surface at the third end,
the fourth bent section is bent toward the first principal surface at the fourth end,
the second bent section is bent toward the first principal surface at the second end,
the third bent section is in contact with a part of a first edge of the one solar cell, the first edge consisting of the first principal surface and a first side surface of the one solar cell, the first side surface extending orthogonal to the first principal surface, the fourth bent section is in contact with a part of a second edge of the other solar cell, the second edge consisting of the second principal surface and a second side surface of the other solar cell, the second side surface extending orthogonal to the second principal surface, one longitudinal end of the wiring member comprises a first bent end portion, the first bent end portion being bent toward the second principal surface at a fifth end of the first resin adhesive layer on the first principal surface of the one solar cell, the fifth end being opposite to the first end, the first bent end portion being bent so as not to overlap the first bus bar electrode on the first principal surface of the one solar cell in a planar view of the solar cell module, and the other longitudinal end of the wiring member comprises a second bent end portion, the second bent end portion being bent toward the first principal surface at a sixth end of the second resin adhesive layer on the second principal surface of the other solar cell, the sixth end being opposite to the second end, the second bent end portion being bent so as not to overlap the second bus bar electrode on the second principal surface of the other solar cell in the planar view of the solar cell module.

6. The solar cell module according to claim 5, wherein a bending angle of each of the third bent section and the fourth bent section is larger than a bending angle of each of the first bent section and the second bent section.

7. The solar cell module according to claim 5, wherein the wiring member comprises a fifth bent section between the first bent section and the third bent section, the fifth bent section being bent in an opposite manner to the first bent section, and a sixth bent section between the second bent section and the fourth bent section, the sixth bent section being bent in an opposite manner to the second bent section.

8. The solar cell module according to claim 5, wherein the first edge is a fulcrum point of the third bent section, and the second edge is a fulcrum point of the fourth bent section.

* * * * *